Oct. 31, 1950 W. Y. PAN ET AL 2,528,167

BAND-SPREAD TUNING INDUCTANCE DEVICE

Filed March 23, 1948

INVENTORS
WEN YUAN PAN &
JOHN LONGO
Philip G. Cooper
ATTORNEY

Patented Oct. 31, 1950 2,528,167

UNITED STATES PATENT OFFICE 2,528,167

BAND-SPREAD TUNING INDUCTANCE DEVICE

Wen Yuan Pan, Merchantville, N. J., and John Longo, Philadelphia, Pa., assignors to Radio Corporation of America, a corporation of Delaware Application March 23, 1948, Serial No. 16,406

10 Claims. (Cl. 250—40)

This invention relates generally to permeability-tuned circuits for spreading certain portions of a tuning frequency range and compressing other portions thereof in a radio receiver, and particularly relates to an inductance coil and associated core assembly for use in a variable band-spread circuit.

Allocation of various portions of the radio wave spectrum by international agreement has resulted in the interspersal of relatively narrow bands of frequencies devoted to the broadcasting of programs for the general public with other bands of frequencies devoted to various services not of interest to the general public. It is feasible to construct a radio receiver capable of receiving at a single position of its band-selector switch two or more of these broadcast bands together with a number of unwanted intermediate bands. For use by the general public, it is desirable to apply the tuning and indicating facilities of the receiver mainly to the useful bands rather than to apply them in part to the unuseful intermediate band or bands. Tuning of the receiver then will be facilitated since the unwanted band will be traversed rapidly while the desired broadcast bands will be traversed at the slow rate necessary for satisfactory tuning of broadcast stations. The indicating dial will be more legible than it would be if the useful frequencies were indicated on small, crowded scales spaced at different portions of a dial calibrated with a uniform frequency scale. Furthermore, it is desirable that the useful dial calibrations be spread out and spaced uniformly, and this result most readily will be achieved if the tuning of the receiver is varied uniformly by the manual tuning control throughout various selected portions of the useful frequency bands.

This problem is not new, and its solution has been accomplished in those receivers which employ variable capacitors as their tuning means by giving the capacitance plates an irregular shape. Such an arrangement was the subject matter of Carlson application, Serial No. 695,572, filed October 28, 1933 now abandoned. Such an arrangement has, however, the disadvantage that the capacitor plates are mechanically weak and tend to vibrate, thus causing microphonic feedback and a most unpleasant howl from the loud speaker. In view of the large microphonic feedback caused by such capacitors, it has been proposed to vary the resonant frequency of a circuit by inductance tuning wherein the tuning coil of the circuit is provided with a core of magnetically permeable material having such a configuration as to spread a certain portion of the frequency band. A magnetically permeable core of such irregular shape, however, is very difficult to mold, it is apt to break and it is not adapted for mass production methods. Thus, both a capacitor with irregularly shaped plates and a coil with a magnetically permeable core of varying cross-section are expensive in manufacture.

A core assembly has long been known for use in tuned transformer-coupled amplifiers of the type used in a radio receiver for increasing the tuning range of the receiver and the damping of the circuits. The core assembly comprised a magnetically permeable core and a copper cylinder as disclosed, for example, by Bailey Patent 1,706,837 of March 26, 1929. The purpose of such prior arrangements was to extend the tuning range in view of the fact that the cores available lacked sufficient high permeability with low loss. The disadvantages of the use of such cores was high loss and lack of selectivity.

It is, accordingly, the principal object of the present invention to provide, in a permeability-tuned circuit of the type used in a high-frequency radio receiver, an inductance coil and core assembly arranged so that with uniform movement of the core assembly with respect to its inductance coil the receiver will be tuned at a substantially uniform, slow rate over a useful frequency band or bands and at a rapid rate over another, unwanted frequency band.

A further object of the invention is to provide a novel permeability-tuned inductive band-spread device for a high-frequency radio receiver.

Another object of the invention is to provide, in a superheterodyne radio receiver, an inductive band-spread device including an inductance coil and a core assembly therefor which may be used interchangeably in both the variable permeability-tuned radio-frequency input circuit and in the variable permeability-tuned tank circuit of the local oscillator of the receiver.

A band-spread device for a radio receiver may comprise a variable tuned circuit which includes a capacitor and an inductance coil. In accordance with the present invention there is provided a core assembly for the inductance coil which includes a magnetically permeable element and a short-circuited coil element. The short-circuited coil element may have a number of short-circuited windings but preferably consists of a single-turn short-circuited coil element of a suitable metal, such as copper. The single-turn short-circuited copper coil may take the form of a ring, a cylinder, or even a solid disc, provided the disc functions at high frequencies like a short-circuited coil. The magnetically permeable element and the short-circuited coil element have each a length that is less than one-half the length of the inductance coil. The result is that for equal movements and for different positions of the core assembly relative to the inductance coil different predetermined rates of increase of the inductance of the coil are produced.

The short-circuited coil element preferably is spaced from the magnetically permeable element approximately by one-half the length of the coil. Another short-circuited core element may be provided at a distance approximately equal to the length of the coil from the magnetically permeable element. The performance of the coil and core assembly is further improved if more than two short-circuited core elements are provided.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4, 5, 6, 7, 8, 9:
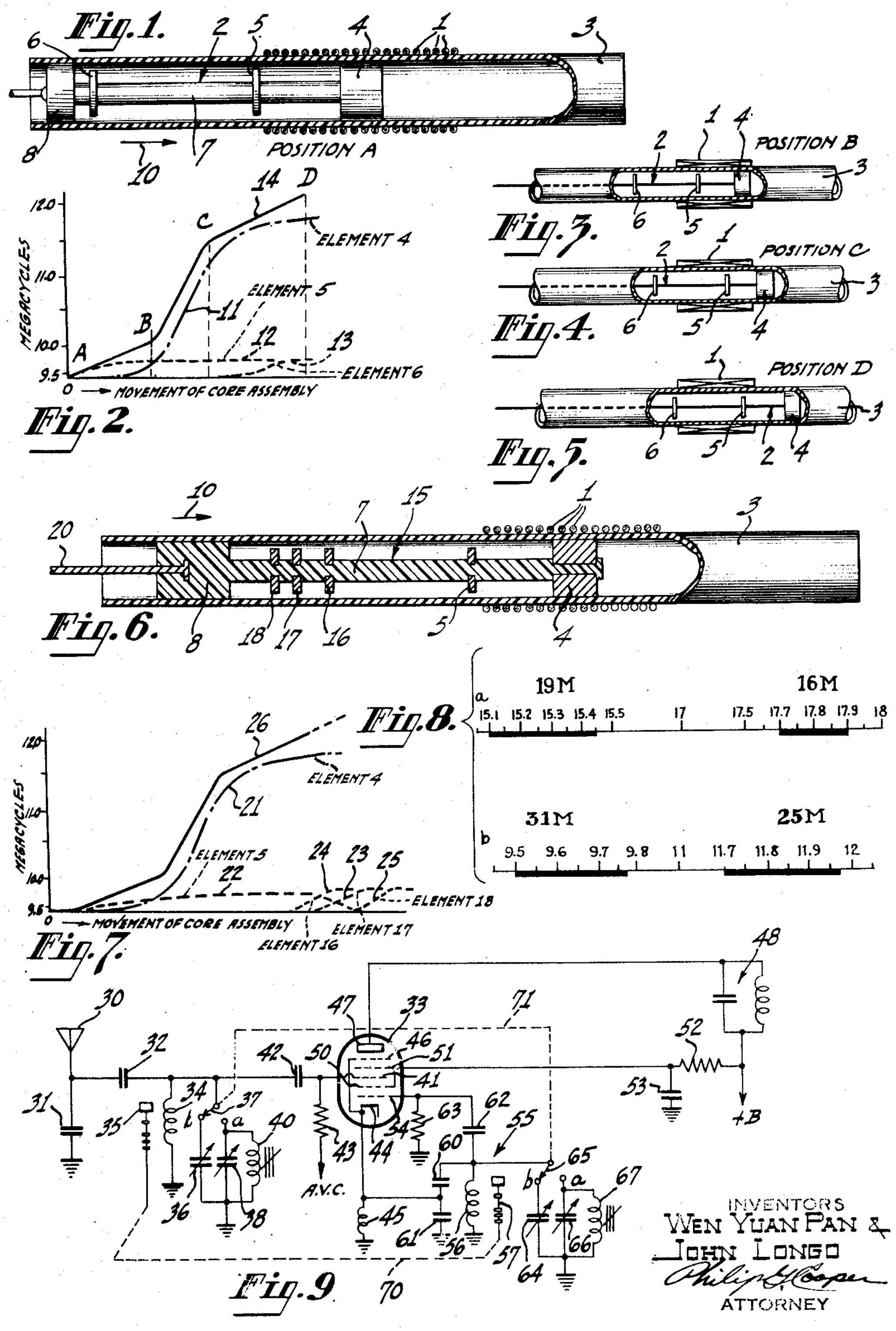
Fig. 1 is a front elevational view, with parts broken away, of an inductance coil and its core assembly embodying the present invention.
Fig. 2 is a graph showing curves illustrating variations of the resonant frequency of a circuit with movement of the core assembly as shown in Fig. 1 relative to its coil.
Figs. 3 to 5 are schematic, front elevational views, with parts broken away, of the coil and core assembly of Fig. 1 shown in different operation positions.
Fig. 6 is a front elevational view, partly in section, of a coil and a modified core assembly embodying the present invention.
Fig. 7 is a graph illustrating curves which show variations in frequency of a tuned circuit with movement of the core assembly of Fig. 6 relative to its associated coil.
Fig. 8 illustrates the dial of a radio receiver provided with the coil and core assembly of the invention.
Fig. 9 is a circuit diagram of the input circuit and converter stage of a superheterodyne radio receiver provided with two permeability-tuned circuits in accordance with the present invention.

Referring now to the drawing and particularly to Fig. 1, there is illustrated inductance coil 1 provided with a core assembly in accordance with the present invention, generally indicated at 2. Inductance coil 1 may be wound on a suitable cylindrical coil form 3 made of insulating material. Core assembly 2 consists of a magnetically permeable element 4 suitable for radio and high frequencies. Magnetically permeable element 4 may consist, for example, of individually insulated particles of carbonyl iron molded under high pressure to the desired shape in accordance with the teachings of the patents to Speed, 1,274,952 and Andrews, 1,669,644. Preferably, element 4 should consist of a material having a high magnetic permeability.

Core assembly 2 further comprises, in accordance with the present invention, two short-circuited coils 5 and 6 spaced from each other and from magnetically permeable element 4. Short-circuited coils 5 and 6 may consist of a number of short-circuited turns of a conducting material but mathematical analysis has revealed that single-turn short-circuited coils will ordinarily suffice. Short-circuited coils 5 and 6 preferably are copper washers or rings but they may be made of any suitable material with or without plating with a metal or they may be in the form of properly supported discs, provided an electromagnetic field will induce therein an eddy current so that they will function like short-circuited coils. The optimum design of the short-circuited coils will depend upon the particular result to be accomplished.

Magnetically permeable element 4 and short-circuited coils 5 and 6 are supported and actuated by control rod 7 which may, for example, be made of an insulating material, such as a synthetic resin of the phenolic aldehyde type. Control rod 7 is provided with a suitable bearing 8 of insulating material which may be molded integral with rod 7 for guiding core assembly 2 in its movement through inductance coil 1. Core assembly 2 is arranged to be moved by the conventional tuning control of a radio receiver, not shown.

Let it be assumed that core assembly 2 is moved toward the right in the direction indicated by arrow 10 from its initial position A of Fig. 1. Core assembly 2 will then successively move to positions B, C and D shown respectively in Figs. 3, 4 and 5. For convenience in explaining the operation of the invention, it will further be assumed that short-circuited coils 5 and 6 have been removed from core assembly 2. In the initial position A, illustrated in Fig. 1, magnetically permeable element 4 is arranged approximately in the center of inductance coil 1 and the effective inductance of the coil is a maximum. When core assembly 2 is moved to position B illustrated in Fig. 3, magnetically permeable element 4 is approaching the trailing edge of inductance coil 1. This will cause a decrease of the inductance of coil 1, thereby increasing the resonant frequency of a circuit including coil 1 and a capacitor in shunt with the coil. The resultant change in frequency of such a resonant circuit has been plotted in Fig. 2 against the movement of core assembly 2 with short-circuited coils 5 and 6 removed. Positions A, B, C and D have been marked in Fig. 2. Thus, curve 11 shows the decrease in inductance of coil 1 and the corresponding increase of the resultant frequency of a resonant circuit caused only by a movement of magnetically permeable element 4. This change in resonant frequency is comparatively small as long as magnetically permeable element 4 moves within the dense electromagnetic field inside coil 1. However, as soon as magnetically permeable element 4 moves from position B to position C, that is, from the dense electromagnetic field inside coil 1 to the relatively weak field outside the coil, the change in the resonant frequency is very rapid as shown by curve 11. Finally, when magnetically permeable element 4 moves from position C to position D, the rate of change of the resonant frequency of the circuit tends to decrease and finally becomes zero because element 4 is too far removed from coil 1 to cause any change of the inductance of coil 1.

Curve 12 of Fig. 2 illustrates the effect on the resonant frequency of the circuit when only short-circuited coil 5 is moved successively from positions A to D, neglecting the effect of permeable element 4. Thus, in position A, short-circuited coil 5 is just about to enter the field developed by coil 1. As short-circuited coil 5 moves from position A to B it enters the dense electromagnetic field within coil 1 and consequently the resonant frequency of the circuit will increase comparatively rapidly while the inductance of coil 1 will decrease correspondingly. Thus, short-circuited coil 5 will compensate for the low rate of inductance change caused by movement of permeable element 4 from position A to position B. As short-circuited coil 5 moves successively from position B to position D, coil 5 remains within the strong field inside the coil and therefore causes no further change of the resonant frequency of the circuit.

The individual effect of a movement of short-circuited coil 6 only with respect to coil 1 is similar to that of short-circuited coil 5 when it reaches similar positions. When core assembly 2 is moved from position A to C with element 4 and coil 5 removed from the core assembly, short-circuited coil 6 remains outside the electromagnetic field developed by coil 1 and therefore causes no change of the resonant frequency. However, when short-circuited coil 6 is moved from position C to position D, coil 6 penetrates the electromagnetic field developed by coil 1 and accordingly increases the resonant frequency as shown by curve 13 of Fig. 2. Short-circuited coil 6 accordingly compensates for the reduced rate of inductance change caused by movement of permeable element 4 from position C to position D.

Curve 14 of Fig. 2 depicts the overall effect of a movement of core assembly 2 including magnetically permeable element 4 and short-circuited coils 5 and 6. It will be observed that while core assembly 2 moves from position A to position B the change of the resonant frequency is uniform and at a slow rate. When core assembly 2 moves from position B to position C the resonant frequency changes relatively rapidly and at a nonuniform rate. Finally, movement of core assembly 2 from position C to position D causes again a slow, uniform change of the resonant frequency.

Thus, it is possible to spread out a desired portion of the frequency range by movement of core assembly 2 from position A to B or from position C to D. On the other hand, movement of the core assembly from position B to C will compress the unwanted frequency band. In a practical case the unwanted 80 per cent of the total frequency band covered by the receiver might be crowded into about 30 per cent of the dial scale, leaving 70 per cent of the dial scale for the useful 20 per cent of the frequency band of the receiver.

Another preferred embodiment of the invention is illustrated in Fig. 6, in which like components are designated by the same reference numerals as were used in Fig. 1. Inductance coil 1 may be made slightly shorter than the inductance coil of Fig. 1 and is wound on cylindrical coil form 3 of insulating material. Core assembly 15 comprises magnetically permeable element 4 and short-circuited coil 5 identical to short-circuited coil 5 of Fig. 1. Core assembly 15 is further provided with a group of three short-circuited coils 16, 17 and 18. As clearly shown in Fig. 6 magnetically permeable element 4 and short-circuited coils 5, 16, 17 and 18 may be molded with control rod 7 and bearing 8. A wire 20 may be molded into bearing 8 for actuating core assembly 15. It is preferred, however, to make short-circuited coil 18 and possibly one of the other short-circuited coils adjustable with respect to the remaining short-circuited coils and magnetically permeable element 4 for a purpose to be described hereinafter. In some cases it may also be desired to make the relative spacing between magnetically permeable element 4 and short-circuited coil 5 adjustable. This may be effected by providing a screw thread between magnetically permeable element 4 and control rod 7.

The changes in frequency of a resonant circuit including inductance coil 1 of Fig. 6 caused by a movement of core assembly 15 has been illustrated by the curves of Fig. 7. Thus, curve 21 shows the changes in frequency caused by a movement of magnetically permeable element 4 alone which is substantially similar to curve 11 of Fig. 2. Curve 22 illustrates the changes in frequency caused when short-circuited coil 5 alone moves into and through coil 1. Since inductance coil 1 of Fig. 6 is shorter than the coil 1 of Fig. 1, or the tuning stroke of core assembly 15 may be made longer, short-circuited coil 5 will be outside of inductance coil 1 at the end of the tuning stroke. Accordingly the change in frequency caused by short-circuited coil 5 alone will decrease again at the end of the tuning stroke as shown by curve 22. Short-circuited coil 17 is provided for the purpose of compensating for the effect of short-circuited coil 5 approaching the trailing edge of coil 1 and moving beyond the coil. The changes in frequency caused by a movement of short-circuited coil 17 alone is illustrated in Fig. 7 by curve 23. Thus, as soon as short-circuited coil 5 approaches and penetrates into the weak electromagnetic field existing at the trailing edge of coil 1, short-circuited coil 17 will approach the leading edge of coil 1 and the change in frequency caused by a simultaneous movement of the two coils will substantially cancel.

Curve 24 illustrates the change in frequency caused by short-circuited coil 16 alone which is similar to that caused by movement of short-circuited coil 6 of Fig. 1. Curve 25 of Fig. 7 finally illustrates the change of frequency caused by movement of short-circuited coil 18. It will be observed that curves 24, 23 and 25 are similar in shape but slightly displaced by a distance corresponding to the distance between short-circuited coils 16, 17 and 18. The purpose of short-circuited coil 18 is to extend the tuning range substantially linearly as shown particularly by the dotted portion of curve 26 of Fig. 7, curve 26 illustrating the combined effect of elements 4, 5, 16, 17 and 18 moving in unison toward and through coil 1. It will accordingly be seen that the coverage of the frequency range may be adjusted by adjusting the relative position of short-circuited coil 18 with respect to the other elements of the core assembly 15. The low frequency end of the frequency range may be adjusted by varying the initial position of the entire core assembly 15 in unison from that illustrated in Fig. 6.

Inductance coil 1 and core assembly 15 may, for example, be used for covering the 31 and 25 meter bands or the 19 and 16 meter bands. A frequency scale which may be obtained with the coil and core assembly of the invention shunted by a capacitor for covering the 31 and 25 meter bands is illustrated in Fig. 8b. The 31 meter band covers the frequencies from 9.5 to 9.775 mc. (megacycles), while the 25 meter band covers the frequency range from 11.7 to 11.975 mc. Fig. 8a illustrates a frequency scale for covering the 19 and 16 meter bands covering respectively the frequency ranges from 15.1 to 15.45 mc. and from 17.7 to 17.9 mc.

The initial spacing of magnetically permeable element 4 from the trailing edge of coil 1 will be determined in part by the extent of the low frequency end of the range to be covered. If this frequency range should be wider than the 31 meter band, for example, the initial position of magnetically permeable element 4 may be slightly to the left of that shown in Fig. 6, whereas if a narrower band were to be covered, magnetically permeable element 4 initially may be positioned further to the right. Ordinarily, slightly more than ⅓ of the tuning stroke will be required to move magnetically permeable element 4 to the trailing edge of coil 1 from its initial position A corresponding to the lowest frequency to be tuned. The higher the permeability of element 4, the smaller could be its width which will further compress the undesired frequency range on its tuning scale.

With the initial position of magnetically permeable element 4 relative to coil 1 determined, short-circuited coil 5 should be so positioned that it will be effective to increase the resonant frequency as it is moved toward coil 1. Short-circuited coil 5 should be large enough so that its movement will increase the resonant frequency sufficiently to cover the desired band. As shown in Figs. 1 and 6, short-circuited coil 5 will initially be positioned slightly outside coil 1. Movement of short-circuited coil 5 alone to the right then will increase the resonant frequency rather abruptly at the beginning of the tuning stroke to supplement the very slow simultaneous increase in frequency caused by a movement of magnetically permeable element 4. The distance between magnetically permeable element 4 and short-circuited coil 5 accordingly amounts to approximately one-half the length of coil 1.

On the other hand, when magnetically permeable element 4 leaves coil 1 its effect progressively decreases which is compensated by providing either short-circuited coil 6 of core assembly 2 or three short-circuited coils 16, 17, 18 of core assembly 15. Thus, short-circuited coil 6 or short-circuited coil 16 is spaced from magnetically permeable element 4 by more than the length of coil 1 and it is spaced from short-circuited coil 5 by less than the length of coil 1. Consequently, short-circuited coil 6 or 16 will approach coil 1 at a little distance therefrom as magnetically permeable element 4 leaves coil 1 resulting in a change of frequency as illustrated by curves 14 or 26.

By way of example, coil 1 may comprise 35 ¼ turns of 0.013 inch diameter copper wire wound to a length of 0.93 inch on a 0.283 inch outside diameter coil form. Thus, coil 1 may have an inductance of 2.5 microhenries. Magnetically permeable element 4 may be 0.234 inch long and 0.246 inch in diameter. Each of short-circuited coils 5, 6, or 5, 16, 17 and 18 may be of copper 0.215 inch outside diameter, 0.125 inch inside diameter, and 0.047 inch in length or width. The spacing of short-circuited coils 5, 16, 17 and 18 from the leading edge of magnetically permeable element 4 may be 0.281 inch, 1.000 inch, 1.125 inches and 1.220 inches, respectively.

Referring now to Fig. 9 there is illustrated by way of example the radio frequency input circuit and converter stage of a broadcast receiver utilizing two inductance coils and core assemblies in accordance with the present invention. The receiver of Fig. 9 comprises antenna 30 for intercepting a modulated carrier wave. Antenna 30 is connected to ground through capacitor 31. Coupling capacitor 32 couples antenna 30 to pentagrid converter tube 33. Actually, capacitors 31 and 32 function as an impedance matching network, and their junction point is connected to antenna 30. Capacitors 31 and 32 are bypassed to ground by inductance coil 34 which may be identical to inductance coil 1 of Fig. 6. The inductance of coil 34 may be varied by core assembly 35 which preferably, as shown schematically, is identical with core assembly 15.

Inductance coil 34 forms part of a tunable radio-frequency input circuit which may be adjusted by trimmer capacitor 36. When the movable arm of switch 37 is in the position marked *b*, trimmer capacitor 36 is connected across inductance coil 34. On the other hand, when switch arm 37 is in position *a*, trimmer capacitor 38 and inductance coil 40 are both connected in parallel with inductance coil 34. When switch arm 37 is in position *b*, the 31 and 25 meter bands may be tuned in and the dial scale of the receiver will be as shown in Fig. 8*b*. On the other hand, when switch arm 37 is in position *a*, the 19 and 16 meter bands may be received and the dial scale is illustrated in Fig. 8*a*.

The high-potential terminal of inductance coil 34 is connected to control grid 41 of converter tube 33 through blocking capacitor 42. An automatic volume control voltage (AVC) is impressed through resistor 43 on control grid 41. Converter tube 33 is provided with cathode 44 connected to ground through choke coil 45. Suppressor grid 46 is tied to cathode 44. Anode 47 is connected to a suitable positive voltage supply indicated at +B through tuned circuit 48. Screen grids 50 and 51 are tied together and connected to +B through dropping resistor 52 which is bypassed to ground by bypass capacitor 53.

The first control grid 54 is connected to the local oscillator circuit generally indicated at 55. The oscillator or tank circuit comprises inductance coil 56 tuned by core assembly 57 which are identical, respectively, to inductance coil 1 and core assembly 15 of Fig. 6. Coil 56 is shunted to ground through capacitors 60 and 61 having their junction point connected to cathode 44. The high-potential terminal of coil 56 is coupled to control grid 54 through coupling capacitor 62. Control grid 54 is connected to ground through grid leak resistor 63.

The tank circuit comprising coil 56 and capacitors 60 and 61 may be shunted by trimmer capacitor 64 by rotating switch arm 65 into position *b*. If switch arm 65 is rotated to position *a*, trimmer capacitor 66 and inductance coil 67 are connected in parallel with inductance coil 56 and capacitors 60, 61. The converter circuit operates in the manner disclosed and claimed in the patent to J. C. Smith, 2,323,250. Oscillator circuit 55 is a Colpitts oscillator. Since the circuit of Fig. 9 functions in a conventional manner, a description of its operation is not deemed to be necessary.

As pointed out hereinabove, inductance coil 34 and its associated core assembly 35 may be identical with inductance coil 56 and its core assembly 57. Both core assemblies 35 and 57 are moved in unison by unicontrol means schematically indicated at 70. When switches 37 and 65 are in the positions indicated at *b*, the receiver will receive the 31 and 25 meter bands. As switches 37 and 65 are moved in unison by a common control indicated schematically at 71 to their *a* positions, the 19 and 16 meter bands may be received. Core assemblies 35 and 57 may be adjusted with respect to their inductance coils 34 and 56 respectively in the manner outlined above. It is also feasible to provide a radio-frequency amplifier having an input circuit similar to that coupled to control grid 41 and including an inductance coil and a core assembly such as shown at 15 in Fig. 6.

The reasons why core assemblies 35 and 57 may be identical are as follows. The difference in frequency of the carrier waves of the 16, 19, 25 and 31 meter bands and the corresponding frequencies which must be developed by the local oscillator to derive the intermediate-frequency signal is comparatively small. Thus, the upper or lower frequency to which the radio-frequency input circuit, consisting of coil 34 and either trimmer capacitor 36 or trimmer capacitor 38 and coil 40, must be tuned almost have the same ratio as the upper or lower frequency to which the tank circuit of the oscillator is tuned which comprises coil 56, capacitors 60, 61 and either trimmer capacitor 64 or trimmer capacitor 66 and coil 67. Furthermore, as described herein, core assemblies 35 and 57 may be adjusted with respect to their associate coils 34 and 56. Any slight misalignment which may still exist is immaterial because the pass band of the radio-frequency input circuit is ordinarily slightly wider than would be required to pass the received carrier waves with their side bands.

The following circuits specifications of the receiver circuit of Fig. 9 are included, by way of example only, as suitable for receiving the 31, 25, 19 and 16 meter bands:

| | |
|---|---|
| Converter tube **33** | Type 6BE6 |
| Capacitor **31** | 47 micromicrofarads |
| Capacitor **32** | 10 micromicrofarads |
| Trimmer capacitor **36** | 5 to 55 micromicrofarads |
| Trimmer capacitor **38** | 3 to 25 micromicrofarads |
| Capacitor **42** | 220 micromicrofarads |
| Capacitor **60** | 22 micromicrofarads |
| Capacitor **61** | 180 micromicrofarads |
| Capacitor **62** | 56 micromicrofarads |
| Trimmer capacitor **64** | 8 to 50 micromicrofarads |
| Trimmer capacitor **66** | 5 to 25 micromicrofarads |
| Capacitor **53** | 10 microfarads |
| Coil **34** | 2.5 microhenries (with core assembly removed) |
| Coil **56** | 2.5 microhenries (with core assembly removed) |
| Coil **40** | 10 microhenries |
| Coil **67** | 10 microhenries |
| Resistor **43** | 470,000 ohms |
| Resistor **63** | 22,000 ohms |
| Resistor **52** | 18,000 ohms |

There has thus been described an inductance coil and associated core assembly which may form part of a variable tuned circuit and which may be used for compressing an unwanted frequency range and for expanding another desired frequency range or ranges. Thus, with a uniform movement of the core assembly with respect to its inductance coil a receiver may be tuned at a substantially uniform, slow rate over two useful frequency bands and at a rapid rate over an intermediate, unwanted frequency band. It is also feasible to utilize physically identical inductance coils and core assemblies for the radio-frequency input circuit of a broadcast receiver as well as for the tank circuit of the local oscillator of the receiver.

What is claimed is:

1. In a band-spread device for a radio receiver comprising a variable tuned circuit including an inductance coil; a core assembly for said coil including a magnetically permeable element and a short-circuited coil element spaced therefrom, said elements each having a length that is less than one-half the length of said coil, thereby to produce for equal movements and for different positions of said assembly relative to said coil different predetermined rates of increase of the inductance of said coil.

2. In a band-spread device for a radio receiver comprising a variable tuned circuit including an inductance; a core assembly for said coil including a magnetically permeable element and a short-circuited coil element, said elements being spaced apart approximately one-half the length of said coil, thereby to produce for equal movement and for different positions of said assembly relative to said coil different predetermined rates of increase of the inductance of said coil.

3. In a band-spread device for a radio receiver comprising a variable tuned circuit including an inductance coil; a core assembly for said coil including a magnetically permeable element, a first short-circuited coil element, and at least one further short-circuited coil element, said first short-circuited coil element being spaced from said magnetically permeable element a distance that is approximately equal to one-half the length of said coil, said further short-circuited coil element being spaced from said magnetically permeable element a distance greater than the length of said coil, thereby to produce for equal movements and for different positions of said assembly relative to said coil different predetermined rates of increase of the inductance of said coil.

4. In a permeability-tuned circuit for spreading portions of a tuning frequency range in a radio receiver, an inductance coil, and a core assembly movable with respect thereto, said core assembly comprising a magnetically permeable element and a first short-circuited coil element spaced apart approximately a distance greater than the length of said coil so that said first short-circuited coil element will compensate for the reduced rate of inductance change caused by said magnetically permeable element approaching and passing through one end of said coil, and a second short-circuited coil element spaced from said magnetically permeable element approximately a distance smaller than the length of said coil so that said second short-circuited coil element will compensate for the low rate of inductance change caused by said magnetically permeable element moving through said coil.

5. In a permeability-tuned circuit for spreading portions of a tuning frequency range and compressing other portions of said range in a radio receiver, an elongated inductance coil; and a core assembly movable with respect thereto, said core assembly comprising a magnetically permeable element, a first short-circuited coil element spaced from said magnetically permeable element a distance greater than the length of said coil, a second short-circuited element spaced from said magnetically permeable element a distance less than the length of said coil, and a third short-circuited element spaced from said first short-circuited element in a direction opposite said magnetically permeable element, whereby movement of said assembly toward and through said coil results for different relative positions of said coil and assembly in predetermined different rates of inductance change.

6. In a permeability-tuned circuit for spreading portions of a tuning frequency range and compressing other portions of said range in a radio receiver, an elongated inductance coil; and a core assembly movable with respect thereto, said core assembly comprising a magnetically permeable element and a plurality of short-circuited coil elements, one of said short-circuited coil elements being spaced from said magnetically permeable element such a distance that it will compensate for the low rate of inductance change caused by said magnetically permeable element moving through said coil, another of said short-circuited coil elements being spaced further from said magnetically permeable element, thereby to achieve inductance variation as a predetermined function of the movement of said assembly with respect to said coil.

7. In a permeability-tuned circuit for spreading portions of a tuning frequency range and compressing other portions of said range in a radio receiver, an elongated inductance coil; and a core assembly movable with respect thereto, said core assembly comprising a magnetically permeable element and a short-circuited coil element, said elements being spaced apart a predetermined distance substantially equal to one-half the length of said coil to effect variation of the inductance of said coil according to a predetermined pattern when said core assembly is moved relative to said coil.

8. In a superheterodyne radio receiver of the type including a permeability-tuned radio-frequency input circuit and an oscillator having a permeability-tuned tank circuit, said input circuit and said tank circuit being tunable over a predetermined frequency range and including each a capacitor and an elongated inductance coil, said inductance coils having identical effective inductive values; two identical core assemblies for said inductance coils and movable with respect thereto for tuning said circuits, each of said assemblies including a magnetically permeable element and a plurality of short-circuited coil elements, whereby equal movements of said assemblies in unison with respect to their associated coils at different relative positions of said assemblies and coils will vary the resonant frequencies of said circuits by unequal increments to spread predetermined portions of said frequency range and to compress other portions thereof.

9. In a superheterodyne high-frequency radio receiver of the type including a tuned radio-frequency input circuit and an oscillator having a permeability-tuned tank circuit, said input circuit and said tank circuit being tunable over a predetermined frequency range and including each a capacitor and an elongated inductance coil, said inductance coils being identical and having identical values of inductance; two identical core assemblies for said inductance coils and movable with respect thereto for tuning said circuits, each of said assemblies including a magnetically permeable element, a first short-circuited core element spaced from said magnetically permeable element a distance that is approximately equal to one-half the length of one of said coils, and at least one further short-circuited core element spaced from said magnetically permeable element a distance that is greater than the length of one of said coils, whereby equal movements of said assemblies in unison with respect to their associated coils at different relative positions of said assemblies and coils will vary the resonant frequencies of said circuits by unequal increments to spread predetermined portions of said frequency range and to compress other portions thereof.

10. In a radio receiver for receiving signals at any frequency within a large portion of the radio frequency spectrum having a plurality of separated allocated broadcast bands, each pair of adjacent allocated bands being separated by a relatively large contiguous range of frequencies within which range there are no desired broadcast signals, the combination of an adjustable tuning circuit including an inductive reactance having an inductive winding and a relatively movable core member, said inductive reactance being continuously variable by relative movement of said core and winding, and a control element for continuously relatively moving said winding and core member to vary the resonant frequency of said circuit continuously through said spectrum, said core member having at least one core element having physical properties which change the effective inductance of said winding upon relative movement thereto and at least one other core element having physical properties which change the effective inductance of said winding in a relatively different direction from said first mentioned change upon relative movement of said winding and the last mentioned core element, wherein the last two mentioned elements are proportioned and disposed with respect to each other along the axis of the winding to vary the resonant frequency of said circuit at low rates within said separated allocated broadcast bands of the portion of the frequency spectrum and at a substantially higher rate within said contiguous range of frequencies upon the same incremental relative movement of said winding and said core member.

WEN YUAN PAN.
JOHN LONGO.

REFERENCES CITED

The following references are of record in the file of this patent:

UNITED STATES PATENTS

| Number | Name | Date |
|---|---|---|
| 377,217 | Thomson | Jan. 31, 1888 |
| 1,898,792 | Shermund | Feb. 21, 1933 |
| 2,259,250 | Jacob | Oct. 14, 1941 |
| 2,325,279 | Schaper | July 27, 1943 |
| 2,363,101 | Van Der Heem | Nov. 21, 1944 |
| 2,394,391 | Martowicz | Feb. 5, 1946 |
| 2,417,188 | Clark | Mar. 11, 1947 |

FOREIGN PATENTS

| Number | Country | Date |
|---|---|---|
| 560,396 | France | July 9, 1923 |